(12) United States Patent
Schmidt et al.

(10) Patent No.: US 10,796,039 B2
(45) Date of Patent: Oct. 6, 2020

(54) 3D FINITE ELEMENT MESH OF A 3D PART THAT COMPRISES A LATTICE STRUCTURE

(71) Applicant: Dassault Systemes, Vélizy-Villacoublay (FR)

(72) Inventors: Martin-Pierre Schmidt, Vélizy-Villacoublay (FR); Jean-Marc Lachaume, Vélizy-Villacoublay (FR); David Leo Bonner, Vélizy-Villacoublay (FR)

(73) Assignee: Dassault Systemes, Velizy-Villacoublay (FR)

( * ) Notice: Subject to any disclaimer, the term of this patent is extended or adjusted under 35 U.S.C. 154(b) by 0 days.

(21) Appl. No.: 16/230,232

(22) Filed: Dec. 21, 2018

(65) Prior Publication Data

US 2019/0197205 A1    Jun. 27, 2019

(30) Foreign Application Priority Data

Dec. 24, 2017    (EP) .................................... 17306931

(51) Int. Cl.
| | |
|---|---|
| *G06T 17/20* | (2006.01) |
| *G06F 30/20* | (2020.01) |
| *G05B 19/4099* | (2006.01) |

(52) U.S. Cl.
CPC ......... *G06F 30/20* (2020.01); *G05B 19/4099* (2013.01); *G06T 17/20* (2013.01); *G05B 2219/49023* (2013.01)

(58) Field of Classification Search
CPC . G05B 19/4009; G06F 17/50; G06F 17/5009; G06F 17/5018; G06T 17/10; G06T 17/205; G06T 2200/04
See application file for complete search history.

(56) References Cited

U.S. PATENT DOCUMENTS

2008/0246766 A1* 10/2008 Yokohari ............... G06T 17/20
                                                                    345/423
2010/0134498 A1    6/2010 Pirzadeh
(Continued)

FOREIGN PATENT DOCUMENTS

EP    1 978 487 A2    10/2008

OTHER PUBLICATIONS

Lo, S. H, "Finite element mesh generation and adaptive meshing", Prog. Struct. Engng Mater., University of Hong Kong, 2002. (Year: 2002).*

(Continued)

*Primary Examiner* — Diane M Wills
(74) *Attorney, Agent, or Firm* — Oblon, McClelland, Maier & Neustadt, L.L.P.

(57) ABSTRACT

The disclosure notably relates to a computer-implemented method for designing a three-dimensional (3D) finite element mesh of a 3D part that includes a lattice structure. The method includes superposing a regular tiling of cells with a solid representation of the 3D part, partitioning the cells into two groups, a first group of cells, each in contact with the solid representation, and a second group of cells, none in contact with the solid representation. The method also includes computing a Boolean union of the first group of cells and the solid representation, the Boolean union forming a volume, finite element meshing the volume of the computed Boolean union while preserving the set of faces of the first group of cells that are shared with the second group of cells, and merging the finite element meshes of the cells of the second group and the meshed volume of the computed Boolean union.

19 Claims, 11 Drawing Sheets

(56) References Cited

U.S. PATENT DOCUMENTS

| | | | |
|---|---|---|---|
| 2011/0205583 A1 | 8/2011 | Young et al. | |
| 2012/0232848 A1* | 9/2012 | Naito | G06F 17/5018 703/1 |
| 2016/0096318 A1 | 4/2016 | Bickel et al. | |
| 2018/0095448 A1* | 4/2018 | Vernon | G06F 17/5018 |
| 2018/0365342 A1* | 12/2018 | Allen | G06F 17/50 |

OTHER PUBLICATIONS

Extended European Search Report dated Jun. 27, 2018, in European Application No. 17306932.9.

Extended European Search Report dated Jun. 27, 2018 in European Application No. 17306931.1.

Shepard et al., "Hexahedral mesh generation for biomedical models in SCIRun," Engineering with Computers: An International Journal for Simulation-Based Engineering, Springer-Verlag, Lo, vol. 25, No. 1 (2009), Aug. 27, 2008, pp. 97-114, XP019711631.

Dumas et al., "Modelling and characterization of a porosity graded lattice structure for additively manufactured biomaterials," Materials & Design, Elsevier, Amsterdam, NL, Feb. 10, 2017, XP085097868.

Sigmund et al., "Topology optimization approaches: A comparative review," Structural and Multidisciplinary Optimization, vol. 48, No. 6, 2013, pp. 1031-1055, XP055485828.

Asadpoure et al., "Incorporating Fabrication Cost into Topology Optimization of Discrete Structures and Lattices," Structural Multidisciplinary Optimization Struct Multidisc Optim (2015) vol. 51: pp. 385-396.

George et al., " the advancing-front mesh generation method revisited," International Journal for Numerical Methods in Engineering, vol. 37, Issue 21, Nov. 15, 1994, (abstract only).

Owen et al., "A Survey of Unstructured Mesh Generation Technology," Proceedings 7$^{th}$ International Mesh Roundtable, Dearborn, Michigan, USA, pp. 239-268.

Valedevit et al., "Topology optimization of lightweight periodic lattices under simultaneous compressive and shear stiffness constraints," International Journal of Solids and Structures, 2015.

* cited by examiner

3D FINITE ELEMENT MESH OF A 3D PART THAT COMPRISES A LATTICE STRUCTURE

FIELD OF THE INVENTION

The invention relates to the field of computer programs and systems, and more specifically to a method, system and program for designing a 3D finite element mesh of a 3D part that comprises a lattice structure.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behaviour of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

CAD/CAE systems are used to enable simulation of a physical system that can belong but is not limited to aeronautics, automobile, marine, and civil engineering. Notably, these systems are used for performing simulations of physical phenomena on physical system by the Finite Element Method (FEM). Such simulations allow predicting the performance (thermal, mechanical or any other physical performance) of a physical system in service, as well as optimizing the design to improve said performance. They also allow predicting the manufacturability of the part. Manufacturability can be at stake in the case of 3D printing, e.g. simulating the print process with phenomena such as heat distribution in the part during direct metal printing. Indeed, phenomena such as residual stresses can be highly problematical in 3D printing, and can prevent a physical system from being certified for use in critical applications such as aeronautics. Being able to simulate phenomena that occur during the print process is thus highly important.

Lattice structures are often used for designing one or more parts a modeled physical system. A lattice structure denotes a repetitive alternating solid and void pattern in a part that models a physical system. The purpose of this lattice pattern can be to tailor the weight, mechanical resistance, heat transfer or other properties of the part. Thus, lattice structures improve the global performances of a part; notably, mechanical stresses can be better distributed through the part thank to the lattice structure. The design and analysis of Lattice Solids has become very important due to increased interest in 3D Printing. 3D printers do not impose almost any limitations on the complexity of a shape. Therefore, designers are free to create very complex shapes which were not previously manufacturable. In particular, 3D Printers can easily print lattice solids.

In order to analyze a modeled physical system by Finite Element Analysis (FEA), it must be decomposed into a multitude of Finite Elements. The process of decomposing a part of the modeled physical system into elements is called meshing. The finer this decomposition, the more precise the finite element analysis will be. It is not uncommon today to see a single mechanical part decomposed into several million elements. In the beginning of Finite Element Analysis, the layout of the mesh was created by hand, but this was a painful process that was a major bottleneck for realizing the true benefit of physics simulation, as every new or improved design involved the task of re-creating this finite element mesh. In the last 20 years, automated 3D meshing has come to replace manual meshing, making the overall cost of the Finite Element Analysis much lower. Two major element shapes are dominant in Finite Element Meshing: the Tetrahedron (Tet), with 4 sides, and the Hexahedron (Hex), with 6 sides. For most types of problems, Finite Element Analysis will be more efficient on Hex elements. In consequence, when meshing by hand, the engineer would introduce a large proportion of these hexahedral elements. However, 3D hex meshing is has proved very difficult to automate. As a result most automated 3D meshing in use today is Tetrahedra based. The sacrifice in computation efficiency is acceptable for users because of the immense gain in overall productivity introduced by automated 3D meshing.

Automated 3D meshing, in general, attempts to fill a volume with finite elements without making too many assumptions about the nature of the volume. Because of all the potential shape variation of the volumes to be filled, the algorithms are necessarily complex and costly in execution time. The most important factor in the execution time of these algorithms is the boundary complexity of the shape to fill.

Automated 3D meshing suffers problems in the case of lattice structures. A first problem is that lattice solids are micro-porous, like a sponge. This means they have particularly high boundary complexity and are very poorly suited to automated 3D meshing which scales in complexity with the boundary. For lattices with tens or hundreds of thousands of unit cells, the boundary becomes too complex, making the use of automated 3D meshing impractical. Another problem is that automated 3D meshing does not produce an identical mesh in each lattice cell, making for uneven results and local artefacts, which create noise and imprecision in the analysis. To avoid such artefacts, the user might choose to generate a finer mesh, but this constitutes a vicious circle as it will aggravate the scaling problem of the first problem mentioned hereinabove. Furthermore, 3D meshing will not take advantage of the repetitive nature of the lattice solid in order to choose element types that are conducive to most efficient computation. In particular, automated 3D meshing will typically fill the solid with tetrahedral elements, whereas the technology of Finite Element Analysis will (in most cases) perform best on a hexahedral-dominant mesh—that is a mesh where the majority of elements are hexahedrons—.

Within this context, there is still a need for an improved design of a 3D structure of 3D finite element mesh of a 3D part that comprises a lattice structure.

SUMMARY OF THE INVENTION

It is therefore provided a computer-implemented method for designing a three-dimensional (3D) finite element mesh of a 3D part that comprises a lattice structure. The method comprises providing a solid representation of the 3D part, providing a regular tiling of cells, each cell comprising a finite element mesh. The method also comprises superposing the regular tiling of cells with the solid representation of the 3D part, partitioning the cells into two groups: (i) a first group of cells, each in contact with the solid representation of the 3D part, and (ii) a second group of cells, none in contact with the solid representation of the 3D part. The method also comprises computing a Boolean union of the first group of cells and the solid representation of the 3D part, the Boolean union forming a volume, finite element meshing the volume of the computed Boolean union while preserving the set of faces of the first group of cells that are shared with the second group of cells, and merging the finite element meshes of the cells of the second group and the meshed volume of the computed Boolean union.

The method may comprise one or more of the following:
the cells of the regular tiling are topologically identical;
trimming the computed Boolean union of the first group of cells and the solid representation of the 3D part;
preserving the set of faces of the first group of cells that are shared with the second group of cells further comprises storing an interface between the first group of cells and the second group of cells, the interface comprising the set of faces of the first group of cells that are shared with the second group of cells;
the step of finite element meshing the volume of the computed Boolean union further comprises incorporating the stored interface on the computed Boolean union;
applying, to the meshed volume of the computed Boolean union, an advanced front mesh generator;
one or more free edges of the incorporated interface are used as initial fronts of the advanced front mesh generator that is applied on the incorporated interface;
one or more free edges of the incorporated interface are preserved from the advanced front mesh generator that is applied on the incorporated interface;
after the partitioning, removing the internal mesh structure of the cells of the first group;
after the partitioning, instantiating the finite element mesh of each cell of the second group.

It is further provided a computer-implemented method of additive manufacturing, comprising providing a three-dimensional (3D) finite element mesh of a 3D part that comprises a lattice structure designed according to the above method, and additive manufacturing the 3D part.

The method of additive manufacturing may comprise one or more of the following:
the step of providing comprises simulating the three-dimensional (3D) finite element mesh of a 3D part that comprises a lattice structure;
the step of simulating the three-dimensional (3D) finite element mesh of a 3D part that comprises a lattice structure comprises simulating at least one physical phenomenon that happens during additive manufacturing;
the at least one simulated physical phenomena is selected among heat distribution in the 3D part during direct metal printing, residual stresses in the 3D part.

It is further provided a computer program comprising instructions for performing the method.

It is further provided a computer readable storage medium having recorded thereon the computer program.

It is further provided a system comprising a processor coupled to a memory, the memory having recorded thereon the computer program.

It is further provided a manufactured 3D part obtainable by the above method of additive manufacturing.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
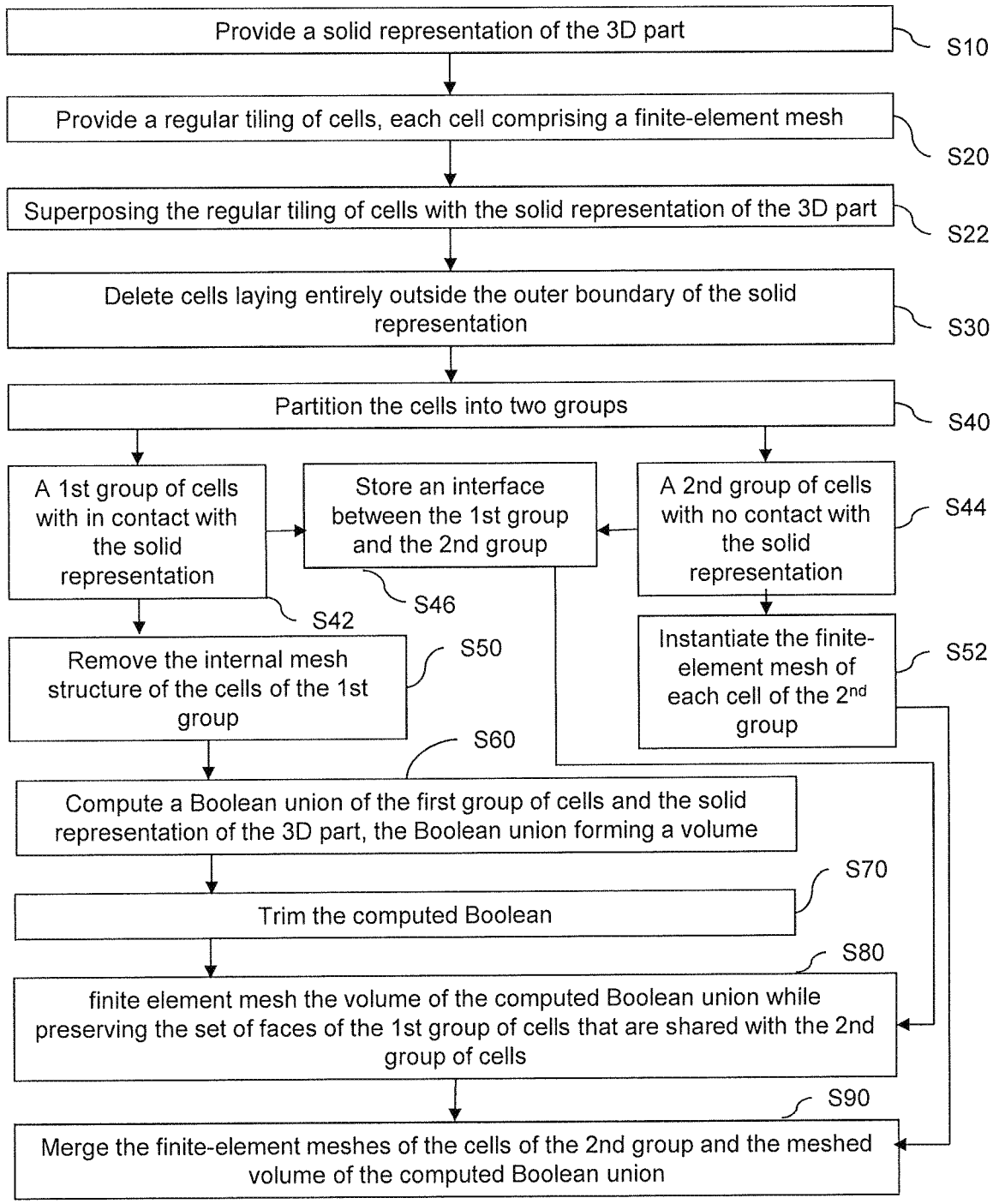
FIG. 1 shows a flowchart of an example of the method.

With reference to the flowchart of FIG. 1, it is proposed a computer-implemented method for designing a three-dimensional (3D) finite element mesh of a 3D part that comprises a lattice structure. The method comprises providing a solid representation of the 3D part and providing a regular tiling of cells. Each cell of the regular tiling comprises a finite element mesh. The method also comprises superposing the regular tiling of cells with the solid representation of the 3D part. Then, the cells are partitioned into two groups of cells, namely a first and a second group. The first group of cells comprises cells that are in contact with the solid representation of the 3D part, and the second group of cells comprises cells that are not in contact with the solid representation of the 3D part. Next, a Boolean union of the first group of cells and the solid representation of the 3D part is computed. The Boolean union forms a volume. Then, the method comprises finite element meshing the volume of the computed Boolean union while preserving the set of faces of the first group of cells that are shared with the second group of cells. Then, the finite element meshes of the cells of the second group are merged with the meshed volume of the computed Boolean union.

Such a method improves the creation of a 3D finite element mesh and allows the analysis by the finite element method of the structural performance of a solid at least partly composed of lattices. The invention does this by first creating a finite element mesh that is associated to each lattice cell. When the individual lattice cells are put together, their associated finite elements are added to the mesh, making the process of generating the overall mesh very efficient. All finite elements match up perfectly, node to node, at the common faces of the cells. The lattice-generated finite element of the lattice region is then attached to the non-lattice area(s) with a filler meshing that creates a mesh in an adaptive way. This is made possible because the set of faces of the first group of cells that are shared with the second group of cells are preserved. Hence, the present invention allows the attachment of the lattice-generated finite elements to the "filler" elements used in the non-lattice areas. A coherent overall mesh is generated.

Hence, the present invention proposes a hybrid meshing approach which uses repetition of pre-computed finite element meshes for all of the lattice region, and filler meshing to fill the non-lattice regions. The filler meshing amounts to say that the creation of a mesh in an adaptive way is performed. The present invention makes the pre-meshed lattice correctly meet up with the filler-meshed non-lattice region. Interestingly, the present invention allows treating the overlapping cells. The end result is a method for meshing lattice solids with performance, reliability and precision higher than could have been done with the previous art. Furthermore, because the present invention relies on pre-computed layouts of finite elements in each lattice cell, it is possible to use a hexahedral-dominant layout for the cell. For many applications a hexahedral-dominant mesh is superior to the tetrahedral-dominant mesh generated by state of the art automated 3D meshing.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

For instance, the steps of providing S10, S20 may be triggered upon user action. For instance, at step S10 of FIG. 1, the user selects a solid representation such as a 3D part and the step S10 is performed as a result of this selection.

A typical example of computer-implementation of a method is to perform the method with a system adapted for this purpose. The system comprises a processor coupled to a memory. Optionally, the system may comprise a display for displaying a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

By "database", it is meant any collection of data (i.e. information) organized for search and retrieval (e.g. a relational database, e.g. based on a predetermined structured language, e.g. SQL). When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

The method generally manipulates modeled objects. A modeled object is any object defined by data stored e.g. in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The 3D modeled object may represent the geometry of a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object designed by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values.

By CAM solution, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systèmes under the trademark DELMIA®.

By CAE solution, it is additionally meant any solution, software of hardware, adapted for the analysis of the physical behavior of a modeled object. A well-known and widely used CAE technique is the Finite Element Method (FEM) which typically involves a division of a modeled object into elements which physical behaviors can be computed and simulated through equations. Such CAE solutions are provided by Dassault Systèmes under the trademark SIMULIA®. Another growing CAE technique involves the modeling and analysis of complex systems composed of a plurality components from different fields of physics without CAD geometry data. CAE solutions allow the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

Figure 2:
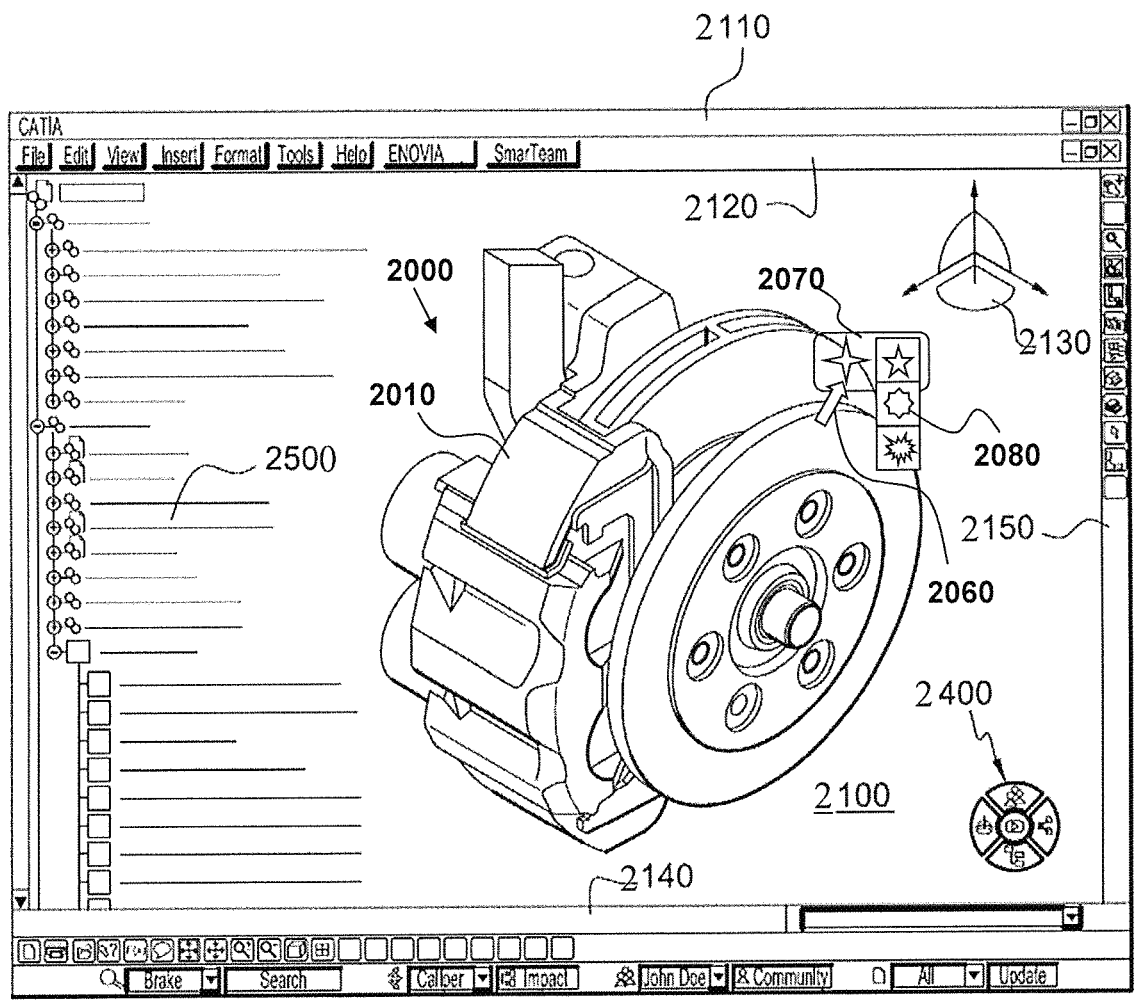
FIG. 2 shows an example of a graphical user interface of a CAD/CAE system.

FIG. 2 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
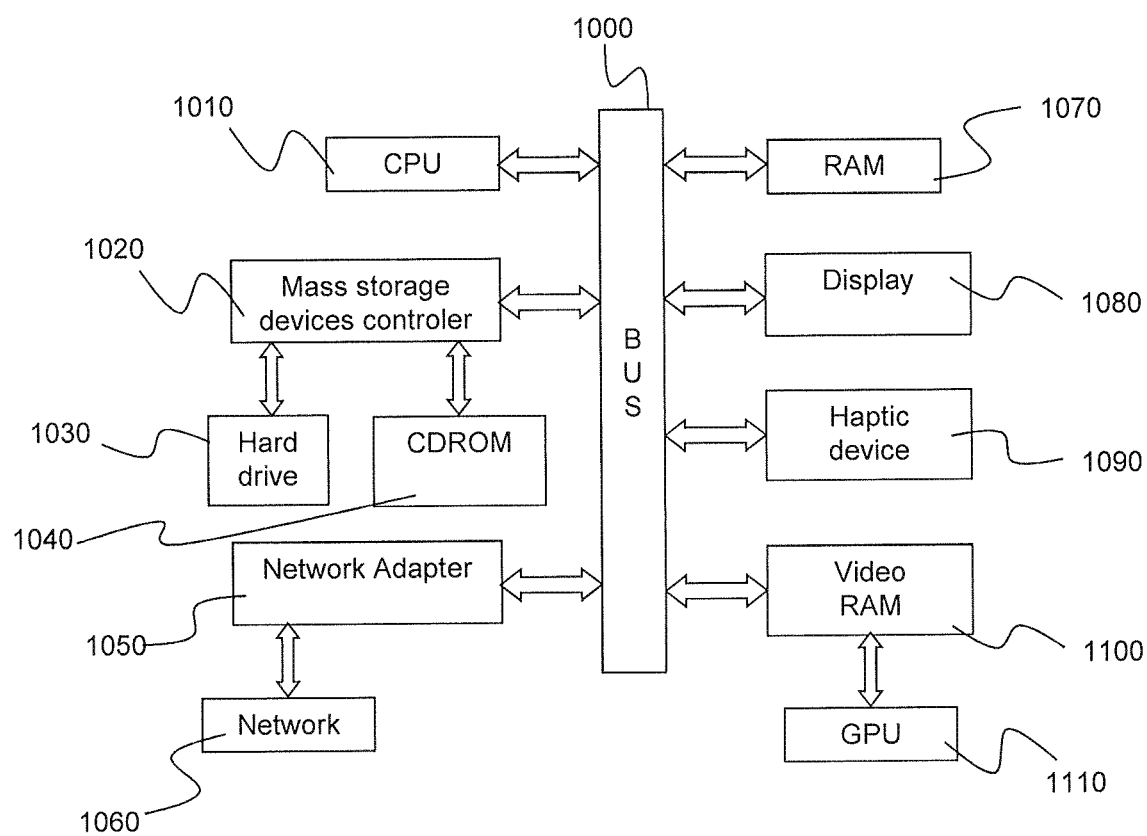
FIG. 3 shows an example of the CAD/CAE system.

FIG. 3 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

"Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The method may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process.

Notably, the manufacturing process including the method may comprise simulations of physical phenomena by FEM. For instance, the 3D representation models the wing of an airplane and FEM is used for simulating the behavior of the wing during a flight. Such FEM simulations allow predicting the performance (thermal, mechanical or any other physical performance) of a physical system in service, as well as optimizing the design to improve said performance. The manufacturing process may comprise predicting the manufacturability of the part, and finally manufacturing the part. Manufacturability can be at stake in the case of 3D printing, e.g. simulating the print process with phenomena such as heat distribution in the part during direct metal printing. Indeed, phenomena such as residual stresses can be highly problematical in 3D printing, and can prevent a physical system from being certified for use in critical applications such as aeronautics. "3D printing of a 3D part" is also referred to as "additive manufacturing a 3D part" or "additive manufacturing a 3D modeled object". Additive manufacturing (AM) designates the process of manufacturing a 3D part by the sequential delivery of energy and/or material to specified points in space to produce the solid 3D part. The material can be, but is not limited to, adding layer-upon-layer of material, whether the material is plastic, metal, concrete . . . . A physical product corresponding to the modeled object (the provided 3D part) is produced. The additive manufactured object may be a product, such as a part, or an assembly of parts. The method improves the manufacturability of a provided 3D representation of a 3D part, and thus the method also improves the manufacturing of a product and thus increases productivity of the manufacturing process.

Referring now to the flowchart of FIG. 1, an example of a method of design of a 3D finite element mesh of a 3D part is discussed. The 3D part comprises lattice structures.

The method may start with providing (S10) a solid representation of a 3D part. The 3D part typically models a physical system, for instance a product of the real world to be manufactured. The 3D part may be a 3D modeled object, as discussed previously. The solid representation comprises at least one cavity to be filled by lattice. A cavity is a volume that may be closed or not. A cavity is a hollow in the provided 3D part; the cavity is therefore empty of any material. More generally, a cavity can be created from any connected subset of the boundary of the solid representation. A connected subset will be referred to as cavity surface thereinafter. In the case that the cavity surface forms a closed volume, this unambiguously defines the space to be filled by lattice. If it does not—that is if the cavity does not form a closed volume—, the cavity surface may comprise one opening, e.g. it resembles a bowl; the cavity may even have two or more openings, e.g. a tunnel with two openings. In practice, to build a closed volume from the cavity surface, the designer will specify one or more cap surfaces. A cap surface exists to block off an opening, like the lid of a jar. The cap surface may be obtained by merging the inner and outer boundaries that would be in place of the opening. A set of one or more of cap surfaces, together with the cavity surface, defines a closed volume.

Figure 17:
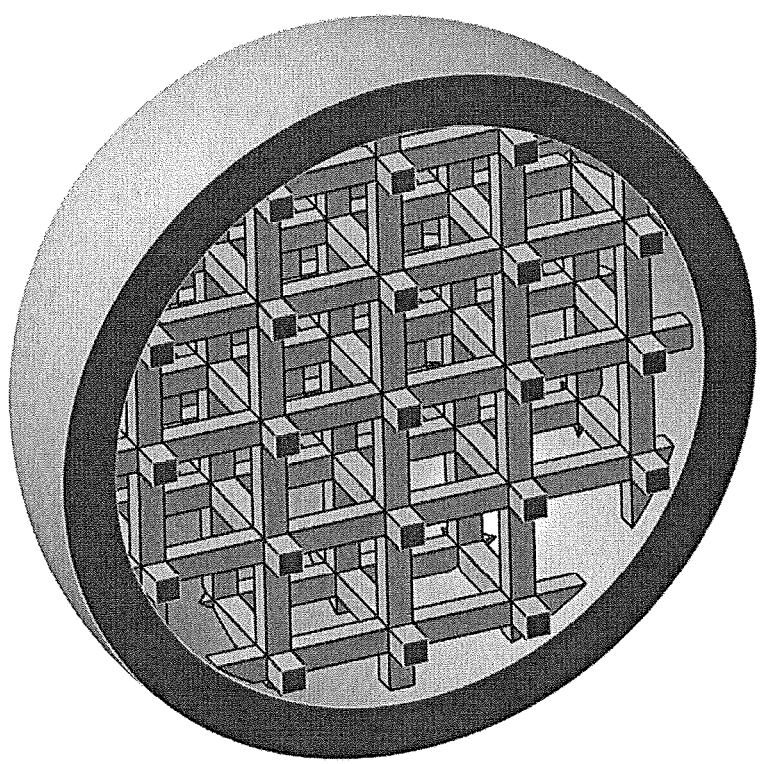
FIGS. 17, 18 and 19 illustrate example of boundary surfaces.
Figure 18:
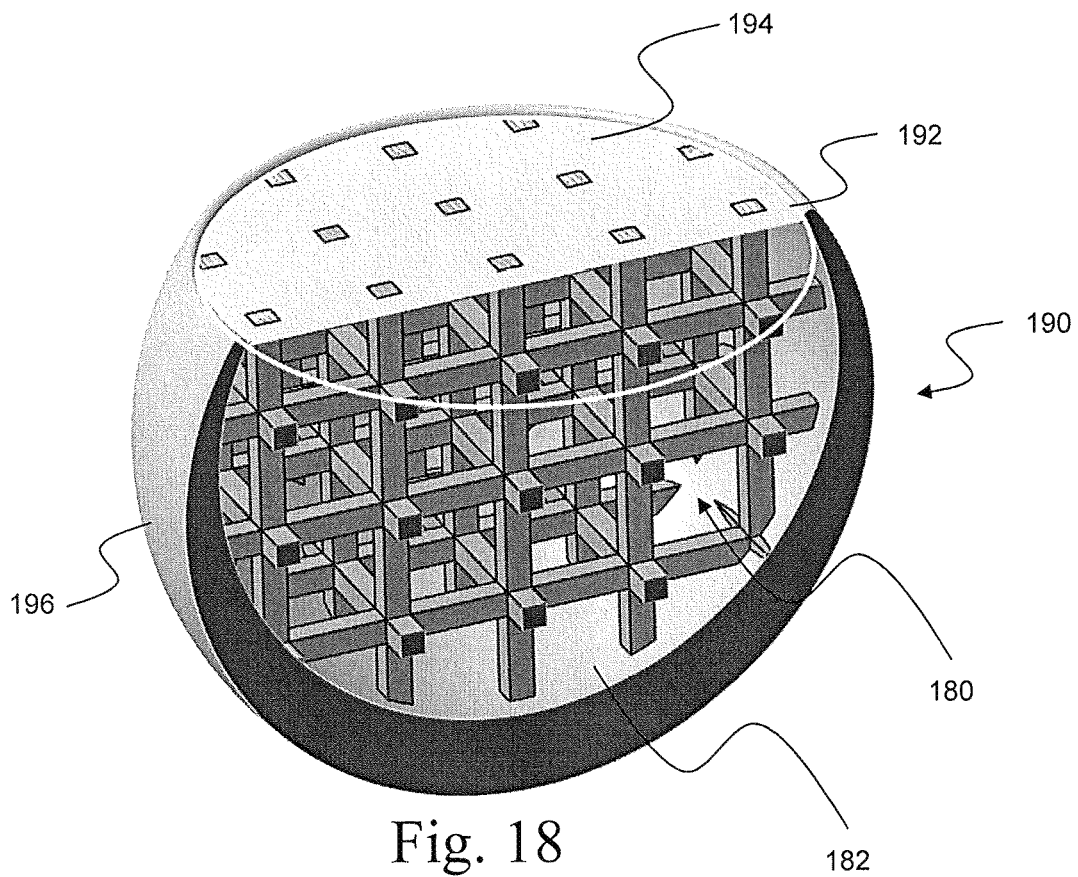
Figure 19:
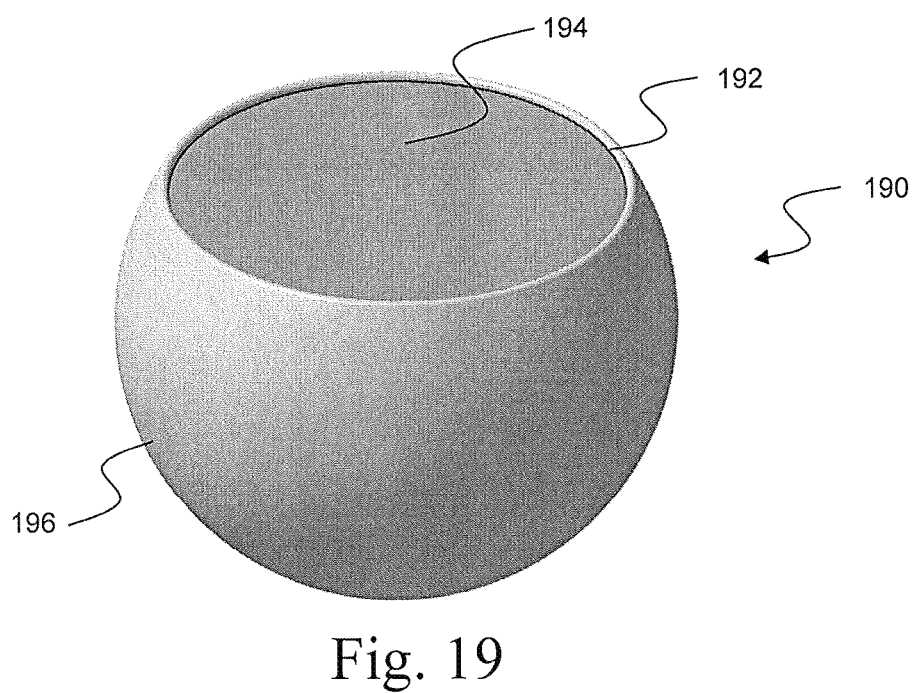

The capping process begins by defining one or more rims, which are a set of 1-Dimensional (1D) curves or lines forming a closed loop on the boundary of the solid representation. The rim or rims are analogous to the rim of a jar, where the jar cap attaches. Then, the cap surface is created as a surface that has this rim as outer boundary. This operation can be implemented by a "fill surface" which is a commonly found functionality in modern CAD/CAM systems. The process of capping open cavities is voluntary; the designer is free to decide which hollows or tunnels in the shape if any, or closed volumes if any, are to be treated as cavities for filling by lattice in the sense of this invention. This is for instance represented on FIGS. 18 and 19. FIG. 18 shows the capped solid 190 of FIG. 19. The capped solid 190 comprises an outer boundary 196, an opening delimited by the rim 192, the opening is filled by a capping surface 194. As illustrated on FIG. 18, the capped solid 190 comprises a cavity 180, which can be filled by lattice. Hence, FIG. 18 illustrates a solid representation of a 3D part comprising one open cavity where the cavity has been treated with a cap surface and filled with lattice. FIG. 17 illustrates also a solid Representation of a 3D part comprising one closed cavity that has been filled with lattice.

A lattice is porous—one can also say alveolar—structure which makes it possible to reduce the density of a material. The term lattice denotes alternating solid and void patterns in a 3D solid part; in other terms, the solid and void patterns may be repetitive. The purpose of lattice is to improve mechanical resistance, stability, heat transfer or other properties of the part. In a non-limiting example, the porosity of the material that is introduced by the lattice structure is equal or larger than 50%: 50% or more of the volume defined by the material is empty (that is, there is no material). It is to be understood that the present invention can be implemented with any kind of lattice structure with any percentage of porosity.

Still in reference to the step S10, the provided solid representation of the 3D part may be displayed, or not. When displayed, the solid representation is shown in a 3D scene, as known in the art.

The solid representation of the 3D part may be a boundary representation (noted B-REP), as known in the art. The B-REP uses topology (vertices, edges, surfaces) and geometry (point, curves, surfaces) information for computing the representation.

The solid representation of the 3D part may be a geometry that is a set of points, segments, polygonal faces or more complex elements (e.g. NURBS based surfaces). More generally, the surface representation is a mesh. No information about the orientation or connectivity of these elements is required. For instance, if the 3D part is modeled with NURBS, the representation will be tessellated (e.g. the representation is triangulated).

As illustrated on FIG. 18, the solid representation 190 comprises an outer boundary 196 and one or more cavity surfaces 182 that form the skin or envelope of the solid representation. The one or more cavity surfaces 182 in combination with the cap surfaces 194 if any, define the cavity or cavities 180 of the solid representation; this amount to say that cavity surface is the part of the skin of the solid representation that is in contact with the cavity. The outer boundary 196 is the part of the skin of the solid representation that is not in contact with the cavity. In the case of a solid which has only closed cavities, as illustrated on FIG. 17, the cavity surface is not connected to the outer boundary. In the case of a solid which has one or more open cavities, as illustrated on FIG. 18, the outer boundary is connected to the cavity surface of said open cavities. The boundary between cavity surface and outer boundary is formed by the one or more rims 192.

Providing the solid representation means that the information required for displaying the solid representation, or at least for computing the solid representation, are available to the computerized system that performs the method. For instance, this information is stored on a memory of the computerized system. The solid representation is provided upon user action, e.g. the user selects a file in on a graphical user interface as known in the art. The solid representation may be automatically provided; no intervention of the user is required in this case.

Figure 4:
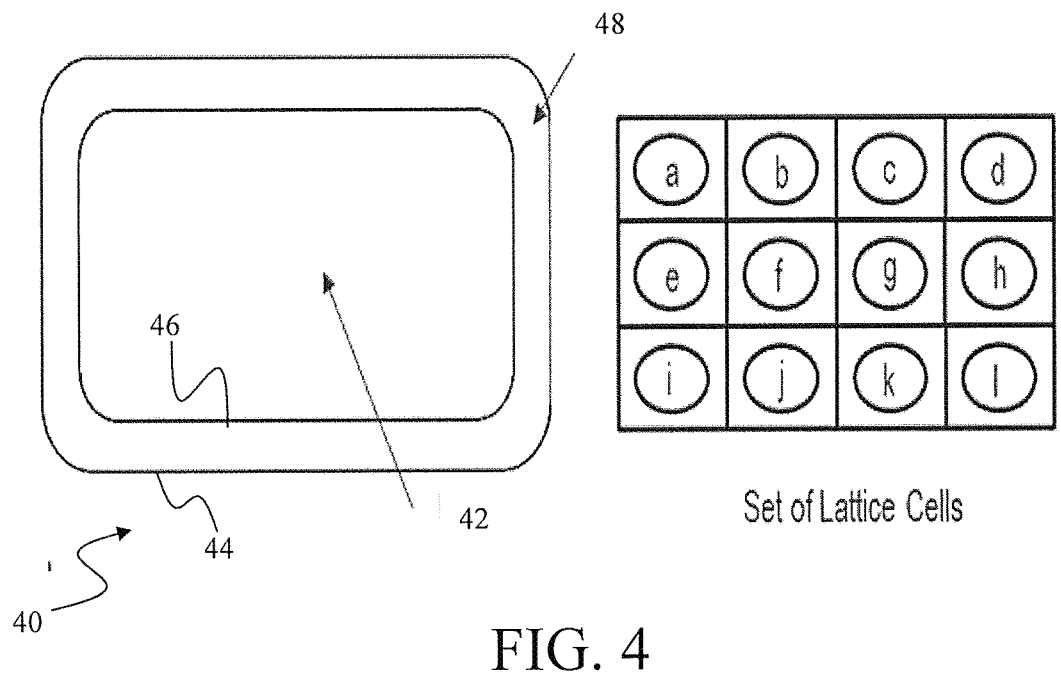
FIGS. 4, 5, 6, 7, 8, 9, 10, 11 and 12 illustrate steps of the flowchart of FIG. 1.

The left part of FIG. 4 illustrates an example of solid representation provided at step S10. In this example, the representation of the 3D part 40 comprises a cavity 42, and this cavity is defined by a material that roughly has a rectangular shape. The material has a thickness 48. The provided solid representation of the 3D part has thus a cavity surface 46 and an outer boundary 44 that form the part of the solid representation that is full of material 48. In this example there are no cap surfaces, and thus the cavity surface entirely defines the cavity 42: the cavity surface comprises a set of faces and each face of this set of faces contributes to define the cavity.

At step S20 of FIG. 1, a regular tiling of cells is provided. The tiling of cells discretizes a volume and each cell represents a sub-volume of the discretized volume; thus, any point within this discretized volume is located (or enclosed) in one cell. A cell is thus a 3D object.

The tiling is a regular tiling, that is, there is an edge-to-edge tiling by congruent regular polygons such as (equilateral) triangles, squares, hexagons, .... In practice, the tiling comprises cells that are tetrahedra or hexahedra, and congruent tetrahedra or hexahedra share at least one common face that match together (the faces coincide): the common faces have the same form and size, and they superimpose one on the other in the tiling. For instance, a regular tiling of cubes forms a regular grid of voxels.

Each cell comprises a finite element mesh: at this step of the method, the finite element mesh may be instantiated or not. If the meshes are not instantiated, they will be at a later stage (S52). FEM is based on a numerical model obtained from the refinement or "discretization" of the problem's domain, combined with additional information necessary for the complete definition of the physical problem. A finite element model is the association of a finite element mesh with a set of simulation attributes. The mesh-generation process of each cell is performed as known in the art, any process generating a mesh can be used without departing from the invention, including manual interactive creation of a particular layout. In "Delaunay Mesh Generation, By S. W. Cheng, T. Dey, and J. Shewchuk. CRC Press, Boca Raton, Fla., 2013. hardcover. ISBN 978-1-58488-730-0» are presented examples of automatic algorithm that may be used in the present invention, being understand that any other mesh generation process can be used. In examples, for the purpose of mesh-generation inside each cell, it is likely that the designer wants to arrange the elements manually. While slow this process will give the best type of arrangement, and since the same cell is likely to be re-used thousands or even millions of times by this invention, the extra effort may be worthwhile. Hence, each cell comprises smaller finite elements. The FEM mesh of each cell is typically tetrahedra or hexahedra, but it is preferably a hexahedral mesh as FEM analysis will perform best on hexahedral-dominant meshed cells. In the present invention, comprising a finite element mesh means that the cell is decomposed into finite elements, or that the cell is decomposable into finite elements and will be decomposed into finite element mesh at a later stage of the method according to the invention.

The cells of the regular tiling may be topologically identical. This makes it possible to reuse the cells; eventually a deformation of one of more cells may be required. The cells may be topologically and geometrically identical and congruent faces of two cells have to match perfectly one each other; the tiling is kept regular by this way. Notably, if correct spacing is respected, there are no intersections possible between the cells of the tiling.

The cells of the tiling are lattice cells. A lattice cell models a pattern representing a lattice structure; said otherwise, a lattice cell is a cell that comprises a porous material. Thus, a lattice cell is not full of material, but is rather partly empty of material. For example, a lattice cell may be a regular hexahedron (a cube) that comprises material along the diagonals of the cube only, e.g. bars of material that connect opposite edges of the cube. As another example, a lattice cell may be a cube that only comprises material along the axes that connect the center of two opposite faces of the cube.

The pattern of a lattice cell is selected such that material at the interface of congruent faces of two cells match. In other word, the pattern repeats in pairs of adjacent faces; the adjacent faces are thus congruent faces. For example, a lattice cube has at the maximum three face patterns: one for each pair of opposite faces of the cube.

All the cell of the regular tiling can present the same pattern, which involves that all the cells have an identical finite element mesh; the mesh-generation of the cells of the regular tiling of cells is thus faster as the mesh generated for one cell will apply to the other cells.

Figure 5:
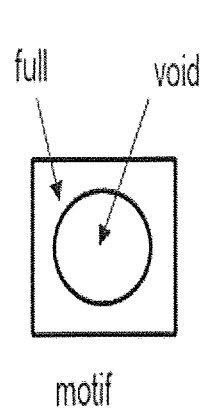

Right part of FIG. 4 shows an example of a set of cells forming a tiling. The tiling is represented in this figure in 2D to facilitate understanding of the figure; the cells (noted a to l) of the tiling of this example are cubes having identical topologies. Each cube is a lattice cell with a basic lattice structure which is a volume located nearby the center of the cell is empty of any material. This is for instance illustrated on in FIG. 5 that shows an example of one of the cells noted a to l in FIG. 4. In FIG. 5, void means empty of material and full means full of material.

Figure 6:
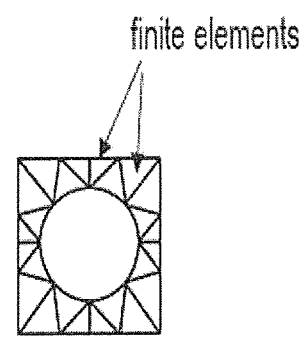

FIG. 6 illustrates the cell of FIG. 5 for which the finite element mesh has been generated or computed. The FEM mesh in this 2D example is triangular, and is analogous to a 3D example with tetrahedral mesh. No FEM mesh is computed for the void volume of FIG. 5.

Figure 13:
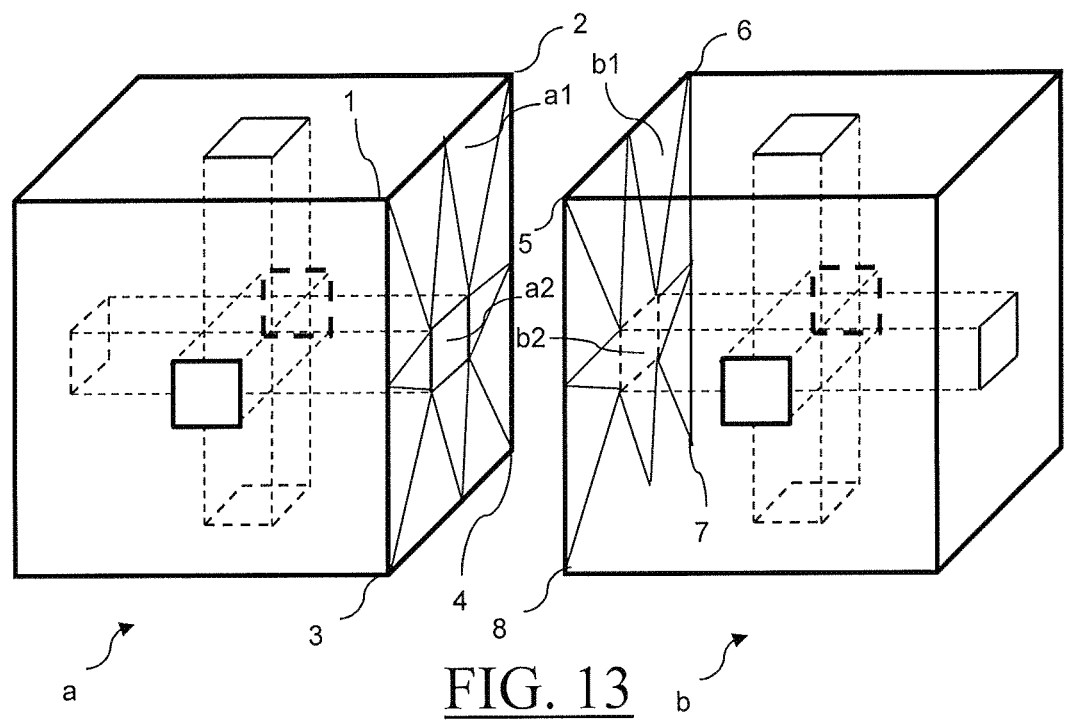
FIG. 13 illustrates two lattice cells.

FIG. 13 show details of the lattice cells noted a and b on FIG. 1. The cells a and b have the same topology and the same lattice pattern. The cells a and b have each a congruent face, respectively a1 and b1, that match. That is to say, the vertex 1 coincides with the vertex 5, respectively 2 with 6, 4 with 7, and 3 with 8. Here, the lattice pattern is recess comprising three though-holes, each through hole being centered on the two opposite faces it passes through. For instance, the hole a2 on the face a1 of the cell a is identical to the hole 2b on the face b1 of the cell b so that the vertices and edges of the triangles of the FEM meshes of the faces a1 and 1b coincide when the cells a and b belong to the tiling.

Referring back to FIG. 1, at step S22, the regular tiling of cells is superposed with the solid representation of the 3D part. The regular tiling may be of size equal or larger than the at least one cavity to be filled by lattice of the solid representation provided at step S10. Superposing the regular tiling with the solid representation means that the regular tiling coincides with the solid representation; more specifically, the regular tiling coincides with the at least one cavity of the solid representation. As a result of step S22, the regular tiling intersects the at least one cavity of the solid representation; the cavity is filled with the regular tiling. If the tiling is larger than the cavity, then a part of the regular tiling will intersect (or clash) the solid representation.

As discussed, the regular tiling can be larger than the cavity. But the regular tiling can even be larger than the capped solid representation. For that reason, cells of the tiling can be outside the capped solid representation as a result of the superposing of step S22. These cells outside the capped solid representation are useless as outside of the at least one cavity of the capped solid representation. At step S30, the cells of the regular tiling that lie entirely outside the capped solid representation are deleted. Hence, the cells of the regular tiling that are in contact (e.g. by clash) with the capped solid representation and/or that are contained in the at least one cavity of the capped solid representation are kept.

The cells not deleted at step S30 are partitioned (step S40) into two groups of cells. Partitioning into two groups amounts to say that the cells are sorted into a first set and a second set of cells.

The first group of cells is created (S42) and comprises the cells that are in contact with the solid representation of the 3D part. To be in contact means that (i) there is a clash between a cell and the solid representation; there is at least one common point between them.

The second group of cells is created (S44) and comprises the cells that have no contact with the solid representation of the 3D part. It is to be understood that the second group may be empty, although such a case does not entirely take advantage of the invention.

The steps S42 and S44 can be performed in the same time, or one after the other.

Figure 7:
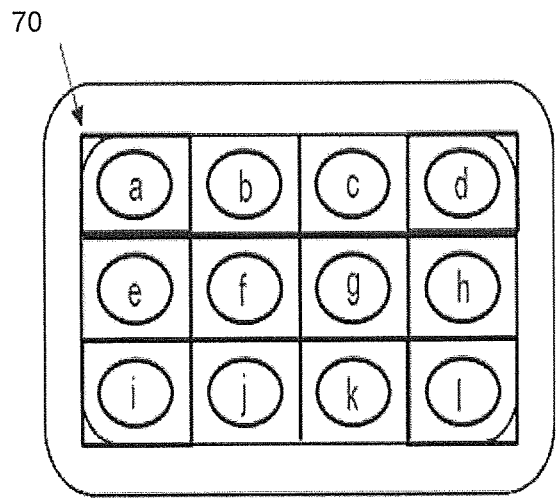
Figure 8:
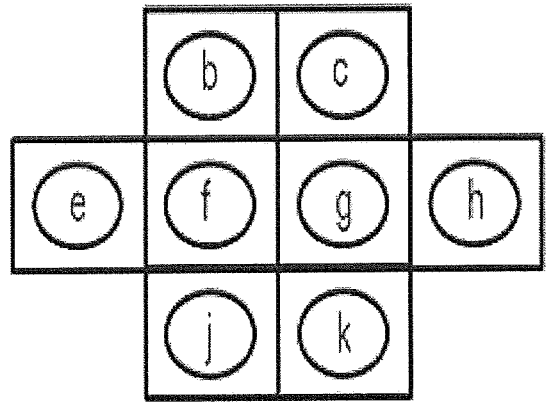

FIG. 7 illustrates the superposing of the regular tiling of cells with the solid representation that are shown on FIG. 4. In this example, the cells noted a, d, i and l are in contact 70 with the solid representation of the 3D part—they clash—. These four cells are therefore added to the first group of cells. The other cells of the tiling are added to the second group of cells with no contact (or no clash) with the solid representation. FIG. 8 shows the representation of the set of non-clashing lattice cells obtained as a result of the step S44.

While the step S40 (which comprises the sub-steps S42, S44) is performed, or after that step S40 has been performed, an interface between the cells of the first group and the cells of the second groups is computed, and finally stored. The interface can be stored for instance in a memory of the system that performs the method of the invention.

The interface comprises the set of faces of the finite element meshes that the first and the second groups have in common. It is to be understood that these faces of the finite element meshes that are common to the first and the second groups rely on the congruent faces of the cells of the first and second groups that match. The interface thus comprises two dimensional (2D) surfaces obtained as a result of the finite element meshing. These 2D surfaces are thus faces of finite elements, typically triangular (tri) or quadrangular (quad), and they may form one or more surfaces, depending on their arrangement. We will refer to these surfaces as 2D finite element surfaces, or 2D finite element meshes.

The boundary of the interface may comprise the free edges of the 2D finite element mesh. Free edges are the edges of the surfaces in contact with holes. In this situation, each connected set of surfaces of the interface will yield one closed poly-line. This closed poly-line (that can also be referred to as loop) defines an outer boundary of the interface. For each outer boundary yielded, zero or more closed poly-lines describing inner boundaries of the interface are defined.

Referring back to FIG. 13, the two cells noted a and b are topologically identical lattice cells and consequently they have the same FEM mesh. Therefore, the triangles of both faces a1, b1 coincide and form the interface.

At step S50 of FIG. 1, the internal mesh structure of the cells of the first group is removed. Said otherwise, the volume finite elements of the cells of the first group are forgotten. Forgetting the interior mesh structure of the first group of cells involves that elements are simply deleted. If the finite element meshes of the cells were not instantiated at the providing step S20, then the step S50 is not performed.

At step S52, the finite element mesh of each cell of the second group is instantiated. This step is performed in the event the finite element meshes of the cells provided at step S20 with the tiling were not instantiated, that is, not computed. The instantiation is performed as known in the art.

Figure 10:
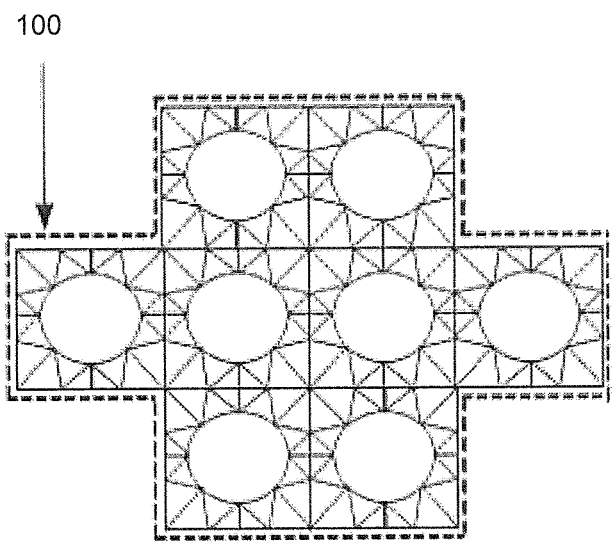

FIG. 10 exemplifies the cells of the second group with their finite element meshes instantiated.

The step S50 (respectively S52) is typically performed just right after the step S42 (S44) have been performed. Alternatively, steps S50, S52 may be performed in the same time.

Then, at step S60, a Boolean union of the first group of cells and the solid representation of the 3D part is computed. The Boolean union operation is done as known in the art, and any algorithm that can compute a Boolean union between parts can be used. A new part is obtained as a result of the Boolean union, and this new part forms a volume. This amounts to say that the Boolean union forms a volume. Notably, this volume still comprises the cavity of the original provided representation, unless the second group of cells is empty—that is, no cells belongs to this second group and all the cells of the tiling belong to the first group of cells—, which involves that the size of the cells of the provided tiling was too coarse compared to the volume of the cavity to fill out with a lattice structure—there is always at least one contact with the solid representation for each cell of the tiling—. If such situation occurs, the method according to the invention may be restarted with a new tiling comprising smaller cells (cells with smaller volume).

The trimmed Boolean union of the first group of cells and the solid representation of the 3D part comprises at least two boundaries. The first one is the outer boundary of the trimmed union, which will typically be composed of one or more two-manifold outer shells each having zero or more two-manifold inner shells. The second one is the boundary initially formed by the interface computed and stored at step S46; the interface boundary comprises one or more one-manifold outer loops, each outer loop having zero or more one-manifold inner loops.

Once step S60 has been performed, it is possible to distinguish within this Boolean union material coming from the cells of the second group only, from the solid representation of the 3D part only, and from the union of the solid representation and cells of the first group. Regarding the material coming from the cells of the first group, cell portions that lie inside the solid representation of the 3D part outer boundary and cell portions that lie outside the solid representation of the 3D outer boundary can be distinguished. The cell portions that lie outside the solid representation of the 3D outer boundary are undesirable as they introduce a deformation of the original shape of the provided solid representation.

In order to preserve the original shape of the solid representation—that is, preserving the outside boundary of the solid representation—, a step of trimming (S70) the computed Boolean union of the first group of cells and the solid representation of the 3D part may be performed. The trimmed union keeps the same outer boundary as the capped solid representation. In other words, the original outer boundary of the provided solid representation is not modified and only the cavity surface of the solid representation (that is, the subset of the skin or envelope of the representation that is in contact with the cavity) can be modified as a result of the union of step S60.

Figure 9:
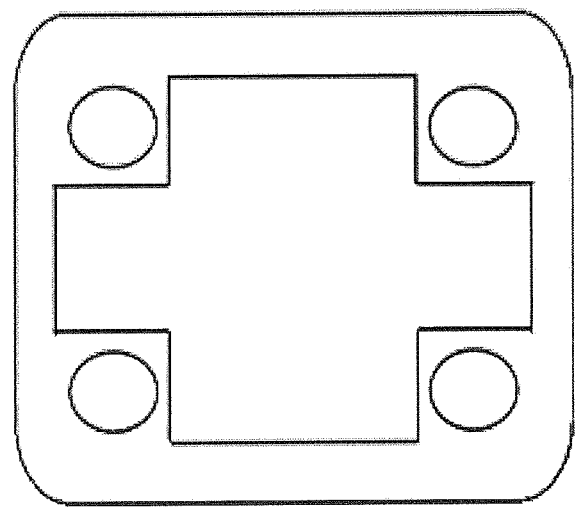

FIG. 9 illustrates the Boolean union of the solid representation of FIG. 4 (left part) and the cells a, d, i and l of the first group. In this example, the trim of step S70 would be not necessary in as much as the cells of the first would not affect the outer envelope of the solid. Hence, the step of trimming is optional and may be executed if a modification of the original outer boundary of the solid representation has been detected or identified.

Next, at step S80, a finite element surface mesh of the boundary of the trimmed union is computed in such a way that the finished surface mesh contains the interface stored at step S46. The resulting surface mesh is the input for computing the finite element mesh of the volume of the computed Boolean union. Therefore, 2D faces forming exactly the interface are thus preserved on the cavity surface of the provided solid representation, this cavity surface having been altered by the Boolean union with the first group of cells. In other terms, the set of faces of the first group of cells that are shared with the second group of cells are preserved. Any finite element mesh generator may be used; particularly, for the surface meshing any triangular or quadrangular mesh generator can be used, and for the volume meshing, any tetrahedral or hexahedral mesh generator can be used.

As a remark, in the case of a closed cavity (FIG. 17) the meshing of the cavity surface and the meshing of the outer boundary of the Boolean union will be separate operations, as the two (cavity surface and outer boundary) are not connected. In contrast, for an open cavity as described in FIG. 18, the meshing of the cavity surface will entail also the meshing of the outer boundary in the same operation, as these are connected. In both cases, all surfaces, cavity and outer boundary, must be meshed first in order to allow the creation of 3D finite elements on the Boolean union.

Figure 11:
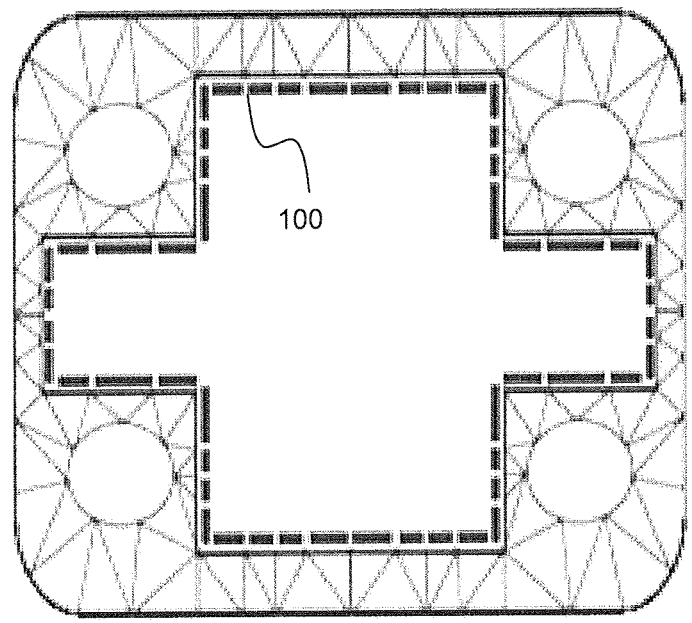
Figure 12:
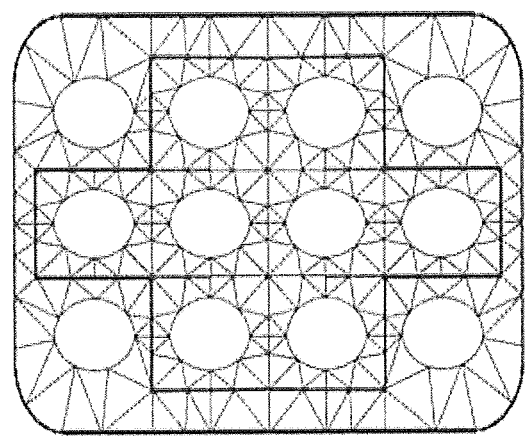

FIG. 11 shows an example of the finite element meshed volume of the Boolean union of FIG. 9. The dotted lines 100 represent the interface of step S46 that has been preserved. Interestingly, this interface 100 is also represented on FIG. 10 as both interfaces on FIGS. 11 and 10 are identical: the inner boundary of the (trimmed or not) the Boolean union is the same as the outer boundary formed by the set of cells of the second group of cells.

During the computation of the Boolean volume, modifications of the cavity surface of the Boolean union may appear. These modifications may notably involve faces (e.g. triangles) that connect a cell with the cavity surface of the solid representation: one or more faces of the cell may be modified for creating the connection with one or more faces of the cavity surface of the volume provided at S10. In other words, the interface boundary of the volume may be slightly different from the one stored at step S46. As a result, the finite element surface mesh of the inner boundary of the Boolean union may not respect the interface stored at step S46, e.g. a point of the finite element surface mesh may be located on a modified triangle.

To ensure that the finite element surface mesh of the cavity surface of the Boolean union (S60, S70) respects the interface between the set of faces of the first and second groups, the stored interface may be incorporated on the finite element surface mesh of the computed Boolean union before the finite element meshing of the volume of the Boolean union is performed. Incorporation of the stored interface may require the execution of at least one of the two strategies defined below. These strategies teach how the original interface (S46) can be respected when computing the finite element mesh of the (trimmed) Boolean union.

In examples, the two strategies may be employed for computing the finite element mesh of the volume of the computed Boolean union. Both strategies rely on the use of an advanced front mesh generator that will be applied on the meshed volume of the computed Boolean union. Any advanced front mesh generator may be used. The main difference between the two strategies is how constraints on meshed volume of the computed Boolean union will modify the propagation of the advancing front.

The first strategy uses one or more free edges of the incorporated interface as initial fronts of the advanced front mesh generator that is applied on the boundary of the Boolean volume. In other terms, a reconstruction of the boundary of the trimmed volume starts from the closed poly-lines (if any) describing the 1D boundary of the interface. Once the 2D surface boundary has been reconstructed, the finite element volume meshing of the Boolean union can be performed with the newly computed finite element surface mesh. Hence, this first strategy can comprise the following steps. First, the interface boundary stored on step S46 is incorporated on the boundary of the trimmed union; for instance, the interface is superposed on the inner boundary of the trimmed union as the interface is coincident by construction. Next, a front generator is applied on the boundary of the trimmed Boolean union, where the polylines (also referred to as loops) describing the inner boundaries are used as initial fronts of the front generator. The result is a finite element surface mesh that incorporates these loops as embedded finite element edges. In other words, the holes (free edges) of the trimmed Boolean union have been filled. Then, due to the embedding of these loops describing the inner boundaries, the finite element mesh that will be computed (S80) will contain a connected subset of finite elements whose boundary coincides exactly with the interface boundary (S46). This subset of finite elements can be deleted. Finally, the 2D finite elements of the interface are assemble (or connected) with the remaining finite elements produced by the front mesh generator. The result will be a 2D finite element surface mesh that incorporates exactly the 2D finite elements of the interface.

The second strategy is similar, but instead of creating a mesh that covers the boundary, and deleting some of the elements afterwards, it creates the mesh selectively, such that each hole of the boundary—that is defined by a set of free edges—of the trimmed volume will be not filled, e.g. by triangles computed by the front mesh generator. This second strategy can comprise the following steps. First, the interface boundary stored on step S46 is incorporated on the boundary of the trimmed union; the incorporation may be performed as for the first strategy. Next, a front generator is applied on the boundary of the trimmed Boolean union, where the polylines (also referred to as loops) describing the outer boundary of the interface are used as initial fronts of the front generator, and vice versa. The front generator is applied on one side only of the front, meaning that (automatically or via user input) the front is made to advance away from the hole or loop interior. The result is a finite element surface mesh where the holes (free edges) of the trimmed Boolean union have not been filled. Then, due to the embedding of the interface obtained at S46, the finite element mesh that will be computed (S80) will comprise a connected subset of finite elements whose boundary coincides exactly with the interface boundary. In other words, the result will be a 2D finite element surface mesh that incorporates exactly the 2D finite elements of the interface.

At step S90, the finite element meshes of the cells of the second group and the meshed volume of the computed Boolean union are merged. As a result, one mesh of finite elements is obtained. The merge can be performed without requiring any further modification of both meshes: indeed, the boundary of the meshed volume of the computed Boolean union and the outer boundary of the cells of the second group present identical finite element surface meshes so that the merge amounts to identifying pairs of common points on both finite element surface meshes. The merge of step S90 is typically performed as known in the art.

Figure 14:
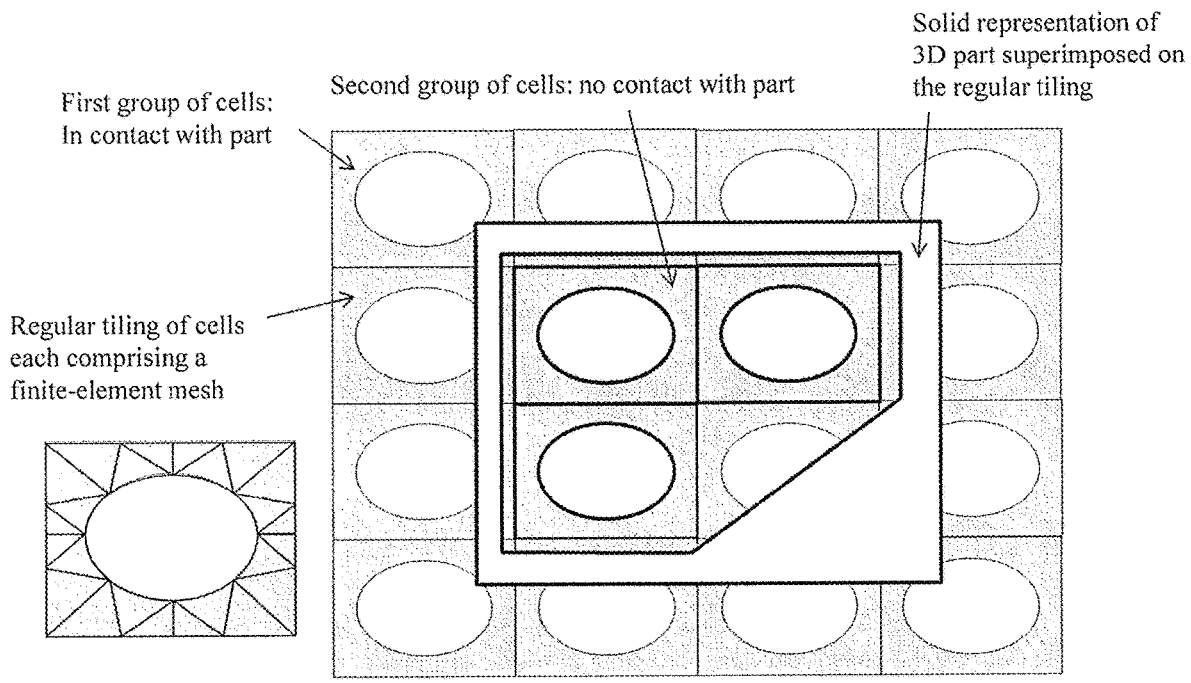
FIGS. 14, 15 and 16 are another illustration of the steps of the flowchart of FIG. 1.
Figure 15:
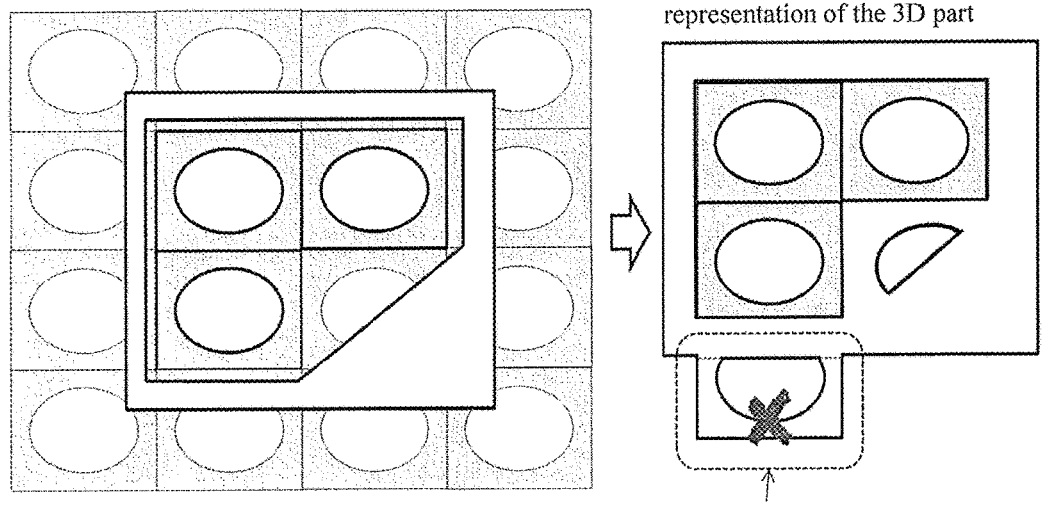
Figure 16:
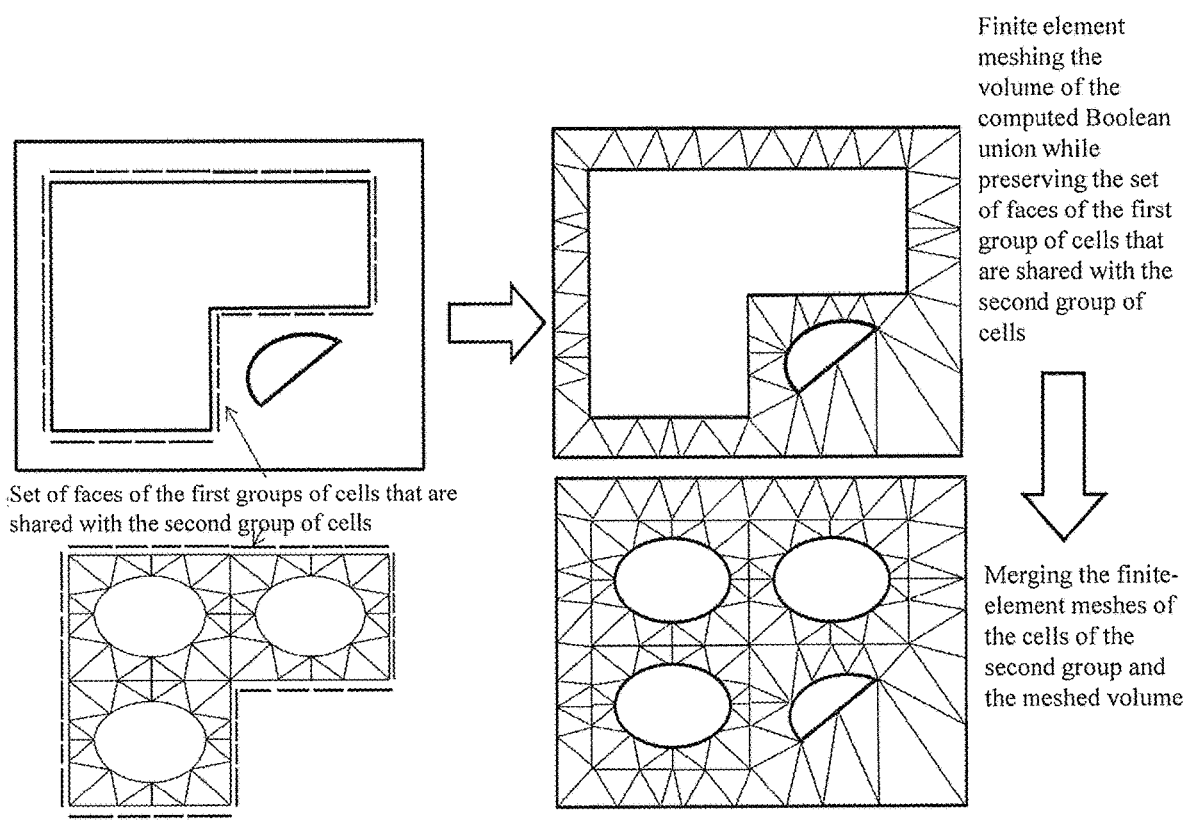

While this invention has been particularly shown and described with references to example embodiments thereof, it will be understood by those skilled in the art that various changes in form and details may be made therein without departing from the scope of the invention encompassed by the appended claims. For instance, FIGS. 14 to 16 show an example of the invention that is similar to the one discussed in reference to FIGS. 4 to 13. In this example, the Boolean union of the first group of cells with the solid representation of the 3D part comprises material lying outside the outer boundary of the solid representation; in this case, the trimming (S70) is required (that is, not optional) in order to preserve the outer boundary of the provided solid representation.

The invention may also comprise additive manufacturing a 3D part that comprises a lattice structure. The 3D part comprises a three-dimensional (3D) finite element mesh designed according to the method previously discussed. Then the 3D part is provided to a 3D printer that performs the additive manufacturing or 3D printing. The 3D printer may be communicatively coupled with the system that provides the 3D part. The 3D printer typically comprises a memory for storing the 3D part. The provided 3D part may be simulated before being additive manufactured; the simulation is typically the simulation of at least one physical phenomenon by the Finite Element Method. The at least one physical phenomenon may be a physical phenomenon that happens during additive manufacturing. For instance, it may be of importance to simulate the heat distribution in the 3D part during direct metal printing, or residual stresses during the print process. Hence, the 3D part benefits of the simulation that predicts the performances of the 3D part in service and/or predict the manufacturability of the additive manufactured 3D part. The manufactured 3D part thus provides improved physical and/or technical characteristics.

The invention claimed is:

1. A computer-implemented method for designing a three-dimensional (3D) finite element mesh of a 3D part that comprises a lattice structure, comprising:
   obtaining a solid representation of the 3D part, the solid representation being full of material and comprising at least one cavity to be filled by a lattice;
   obtaining a regular tiling of cells, each cell comprising a finite element mesh, the cells of the tiling being lattice cells, wherein a lattice cell is partly empty of material;
   superposing the regular tiling of cells with the solid representation of the 3D part;
   partitioning the cells into two groups:
   a first group of cells, each in contact with the solid representation of the 3D part, and
   a second group of cells, none in contact with the solid representation of the 3D part;
   computing a Boolean union of the first group of cells and the solid representation of the 3D part, the Boolean union forming a volume;
   finite element meshing the volume of the computed Boolean union while preserving the set of faces of the first group of cells that are shared with the second group of cells; and
   merging the finite element meshes of the cells of the second group and the meshed volume of the computed Boolean union.

2. The computer-implemented method of claim 1, wherein the cells of the regular tiling are topologically identical.

3. The computer-implemented method of claim 2, further comprising:
   trimming the computed Boolean union of the first group of cells and the solid representation of the 3D part.

4. The computer-implemented method of claim 2, wherein preserving the set of faces of the first group of cells that are shared with the second group of cells further comprises:
   simulating by a computer a three-dimensional (3D) finite element mesh of a 3D part that comprises the designed lattice structure; and
   additive manufacturing the 3D part.

5. The computer-implemented method of claim 2, further comprising:
applying, to the meshed volume of the computed Boolean union, an advanced front mesh generator.

6. The computer-implemented method of claim 1, further comprising:
trimming the computed Boolean union of the first group of cells and the solid representation of the 3D part.

7. The computer-implemented method of claim 6, wherein preserving the set of faces of the first group of cells that are shared with the second group of cells further comprises:
simulating by a computer a three-dimensional (3D) finite element mesh of a 3D part that comprises the designed lattice structure; and
additive manufacturing the 3D part.

8. The computer-implemented method of claim 6, further comprising:
applying, to the meshed volume of the computed Boolean union, an advanced front mesh generator.

9. The computer-implemented method of claim 1, wherein preserving the set of faces of the first group of cells that are shared with the second group of cells further comprises:
storing an interface between the first group of cells and the second group of cells, the interface comprising the set of faces of the first group of cells that are shared with the second group of cells.

10. The computer-implemented method of claim 9, wherein the step of finite element meshing the volume of the computed Boolean union further comprises:
incorporating the stored interface on the computed Boolean union.

11. The computer-implemented method of claim 10, wherein one or more free edges of the incorporated interface are used as initial fronts of an advanced front mesh generator that is applied on the incorporated interface, and
wherein the method further comprises:
applying, to the meshed volume of the computed Boolean union, the advanced front mesh generator.

12. The computer-implemented method of claim 10, wherein one or more free edges of the incorporated interface are preserved from an advanced front mesh generator that is applied on the incorporated interface, and
wherein the method further comprises:
applying, to the meshed volume of the computed Boolean union, the advanced front mesh generator.

13. The computer-implemented method of claim 9, further comprising:
applying, to the meshed volume of the computed Boolean union, an advanced front mesh generator.

14. The computer-implemented method of claim 1, further comprising:
applying, to the meshed volume of the computed Boolean union, an advanced front mesh generator.

15. The computer-implemented method of claim 1, further comprising after the partitioning:
removing the internal mesh structure of the cells of the first group.

16. The computer-implemented method of one of claim 1, further comprising after the partitioning:
instantiating the finite element mesh of each cell of the second group.

17. A method of additive manufacturing, comprising:
simulating by a computer a three-dimensional (3D) finite element mesh of a 3D part that comprises the designed lattice structure; and
additive manufacturing the 3D part.

18. A non-transitory computer readable medium having stored thereon a computer program comprising instructions for performing the method of claim 1.

19. A system comprising:
a processor coupled to a memory and a graphical user interface,
wherein the memory having recorded thereon the computer program for designing a three-dimensional (3D) finite element mesh of a 3D part that comprises a lattice structure that when executed by the processor causes the processor to be configured to:
obtain a solid representation of the 3D part, the solid representation being full of material and comprising at least one cavity to be filled by a lattice;
obtain a regular tiling of cells, each cell comprising a finite element mesh, the cells of the tiling being lattice cells, wherein a lattice cell is partly empty of material;
superpose the regular tiling of cells with the solid representation of the 3D part;
partition the cells into two groups:
a first group of cells, each in contact with the solid representation of the 3D part, and
a second group of cells, none in contact with the solid representation of the 3D part;
compute a Boolean union of the first group of cells and the solid representation of the 3D part, the Boolean union forming a volume;
finite element mesh the volume of the computed Boolean union while preserving the set of faces of the first group of cells that are shared with the second group of cells; and
merge the finite element meshes of the cells of the second group and the meshed volume of the computed Boolean union.

* * * * *